US007921004B2

(12) United States Patent
Elfadel et al.

(10) Patent No.: US 7,921,004 B2
(45) Date of Patent: Apr. 5, 2011

(54) METHODS AND APPARATUS FOR ANALYZING TRANSMISSION LINES WITH DECOUPLING OF CONNECTORS AND OTHER CIRCUIT ELEMENTS

(75) Inventors: Ibrahim M. Elfadel, Ossining, NY (US); Hao Ming Huang, Katonah, NY (US); Albert E. Ruehli, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 12/061,269

(22) Filed: Apr. 2, 2008

(65) Prior Publication Data

US 2008/0182522 A1 Jul. 31, 2008

Related U.S. Application Data

(63) Continuation of application No. 11/356,636, filed on Feb. 17, 2006, now abandoned.

(51) Int. Cl.
*G06F 17/50* (2006.01)
(52) U.S. Cl. .................................. 703/14; 716/4; 716/6
(58) Field of Classification Search .................... 703/13, 703/14, 2; 716/4, 6, 7
See application file for complete search history.

(56) References Cited

U.S. PATENT DOCUMENTS

| | | | |
|---|---|---|---|
| 4,058,715 A | 11/1977 | Niwa | |
| 4,713,829 A | 12/1987 | Eyuboglu | |
| 5,157,667 A | 10/1992 | Carusone, Jr. et al. | |
| 5,313,398 A * | 5/1994 | Rohrer et al. | 703/14 |
| 5,920,484 A * | 7/1999 | Nguyen et al. | 703/2 |
| 6,463,105 B1 | 10/2002 | Ramesh | |
| 6,601,222 B1 | 7/2003 | Mehrotra et al. | |
| 6,647,367 B2 | 11/2003 | McArthur et al. | |
| 6,662,149 B1 * | 12/2003 | Devgan et al. | 703/14 |
| 6,718,530 B2 | 4/2004 | Kim et al. | |
| 6,832,180 B1 | 12/2004 | Sutera et al. | |
| 7,340,698 B1 * | 3/2008 | Srinivasan et al. | 716/4 |
| 7,415,403 B2 * | 8/2008 | McGaughy | 703/14 |
| 2004/0015793 A1 * | 1/2004 | Saxena et al. | 716/4 |
| 2004/0205683 A1 * | 10/2004 | Kovacs-Birkas et al. | 716/6 |
| 2004/0216063 A1 * | 10/2004 | Dickey et al. | 716/7 |
| 2005/0177325 A1 | 8/2005 | Deutsch et al. | |

(Continued)

OTHER PUBLICATIONS

Gander et al., "Waveform relaxation technique for longitudinal partitioning of transmission lines", IEEE, 2006.*

(Continued)

*Primary Examiner* — Paul L Rodriguez
*Assistant Examiner* — Kandasamy Thangavelu
(74) *Attorney, Agent, or Firm* — Ryan, Mason & Lewis, LLP (57) ABSTRACT

Methods and apparatus are provided for analyzing transmission lines with decoupling of connectors and other circuit elements. According to one aspect of the invention, circuits with one or more parasitic elements are analyzed by partitioning at least one of the parasitic elements in a transverse manner; identifying a plurality of subcircuits each comprised of partitioned circuit elements from the plurality of transmission lines and one or more parasitic elements in a given path; wherein each of the subcircuits is associated with a path in the circuit; performing a waveform relaxation analysis between each of the subcircuits; and repeating the step of performing the waveform relaxation analysis using waveforms determined in a previous iteration until convergence to a resultant waveform has occurred. The circuit can optionally further comprise one or more transmission lines which would also be partitioned in a transverse manner.

20 Claims, 7 Drawing Sheets

U.S. PATENT DOCUMENTS

2007/0033561 A1* 2/2007 Jones et al. .................. 716/6

OTHER PUBLICATIONS

Chiprout et al., "Interconnect and substrate modeling and analysis: An overview", IEEE 1998.*

O'Connor et al., "Photonic interconnect layer on CMOS by wafer-scale integration", Information Society Technologies, 2005.*

U.S. Appl. No. 10/776,716, filed Feb. 11, 2004.

Nakhla et al., "Simulation of Coupled Interconnects Using Waveform Relaxation and Transverse Partitioning," EPEP'04, vol. 13, pp. 25-28, Portland, OR, Oct. 2004.

Lelarasmee et al., "The Waveform Relaxation Method for time-domain Analysis of Large Scale Integrated Circuits", IEEE, vol. CAD-1, No. 3, Jul. 1982.

* cited by examiner

METHODS AND APPARATUS FOR ANALYZING TRANSMISSION LINES WITH DECOUPLING OF CONNECTORS AND OTHER CIRCUIT ELEMENTS

CROSS-REFERENCE TO RELATED APPLICATIONS

This application is a continuation of U.S. patent application Ser. No. 11/356,636, filed Feb. 17, 2006, now abandoned, which is incorporated herein by reference.

FIELD OF THE INVENTION

The present invention relates to the analysis of electrical circuits, and more particularly, to the analysis of transmission line circuits using Transversal Waveform Relaxation techniques.

BACKGROUND OF THE INVENTION

Electrical circuits with transmission lines are typically analyzed to ensure proper functioning of the circuits. The coupling between multiple lines and the resultant coupled signals are an important aspect of these transmission line circuits. Power distribution systems, for example, often must be analyzed for stability and other properties. Similarly, in instrumentation circuits and computer circuitry in tacks or cabinets the noise coupled between transmission lines needs to be understood and minimized.

A number of techniques have been proposed or suggested fob analyzing multiple wire transmission lines. Such techniques are described, for example, in Clayton Paul, Analysis of Multiconductor Transmission Lines, Ch. 5 (Wiley, 1994). While these techniques are suitable for the analysis of models with a few lines, the complexity increases rapidly as the number of lines increases. Some simplified techniques have been proposed to approximate the solution for many transmission lines with only neighbor-to-neighbor wire coupling. These approaches are suitable where reduced accuracy is acceptable to gain speed.

Existing techniques for analyzing multiple wire transmission lines are limited in the number of coupled lines or wires that can be analyzed simultaneously. The complexity of the coupling calculation increases rapidly as the number of lines increases, and the accuracy of the results decreases with the increasing number of lines. Hence, the existing techniques are unable to handle a large number of lines due to excessive computation time and the results become questionable. Some prior art techniques ignore the couplings for more than two lines to speed up the process. Other techniques are based on having only linear circuits to speed up the calculation process and are therefore unsuitable for handling even typical transmission line circuits, which include surrounding nonlinear drivers and receivers.

U.S. patent application Ser. No. 10/776,716, entitled "System and Method For Efficient Analysis of Transmission Lines," incorporated by reference herein, discloses "Transversal Waveform Relaxation" techniques for analyzing multiple wire transmission lines by determining which sources influence each of a plurality of transmission lines, based on coupling factors. Transmission line parameters are computed based on the sources, which influence each transmission line. A transient or frequency response is analyzed for each transmission line by segmenting each line to perform an analysis on that line. The step of analyzing is repeated using waveforms determined in a previous iteration until convergence to a resultant waveform has occurred. For a more detailed discussion of such Transversal Waveform Relaxation techniques, see, for example, Nakhla et al., "Simulation of Coupled Interconnects Using Waveform Relaxation and Transverse Partitioning," EPEP'04, Vol 13, pp 25-28, Portland, Oreg., October 2004, incorporated by reference herein.

While such Transversal Waveform Relaxation techniques have greatly improved the analysis of multiple wile transmission lines and provide an efficient approach for transverse decoupling of transmission lines, they suffer from a number of limitations, which if overcome, could provide further improvements. In particular, the connectors in such transmission lines are still coupled. A need therefore exists for a Transversal Waveform Relaxation algorithm that decouples entire paths from each other.

SUMMARY OF THE INVENTION

Generally, methods and apparatus are provided for analyzing transmission lines with decoupling of connectors and other circuit elements. According to one aspect of the invention, circuits with one or more parasitic elements are analyzed by partitioning at least one of the parasitic elements in a transverse manner; identifying a plurality of subcircuits each comprised of partitioned circuit elements from the plurality of transmission lines and one or more parasitic elements in a given path; wherein each of the subcircuits is associated with a path in the circuit; performing a waveform relaxation analysis between each of the subcircuits; and repeating the step of performing the waveform relaxation analysis using waveforms determined in a previous iteration until convergence to a resultant waveform has occurred. The circuit can optionally further comprise one or mole transmission lines which would also be partitioned in a transverse manner.

Each of the circuit elements, such as the transmission lines and parasitic elements, are represented using a circuit macromodel. The circuit macromodel separates each path that enters and exits a given element such that it is coupled only with elements suitable for waveform relaxation analysis.

According to another aspect of the invention, electrical couplings between the paths of the circuit are embodied using current controlled sources. At each step of the waveform relaxation analysis, the states of the sources are updated using the path states from a previous step.

A more complete understanding of the present invention, as well as further features and advantages of the present invention, will be obtained by reference to the following detailed description and drawings.

DETAILED DESCRIPTION

The present invention provides methods and apparatus for analyzing transmission lines with decoupling of connectors, such that entire paths are decoupled from each other. The electrical couplings between the paths of the multipath circuit are embodied using current controlled sources. At each step of the Transversal Waveform Relaxation process, the states of these sources are updated using the path states from the previous step. Since the capacitive and inductive couplings are generally weak in a multipath design, the Transversal Waveform Relaxation process converges in a rapid manner to the correct signal waveforms for all paths.

First, a discussion is presented of suitable techniques for Transversal Waveform Relaxation. Thereafter, a detailed discussion is provided of various aspects of the present invention, in a section entitled "Decoupling of Connectors."

Transversal Waveform Relaxation Background

Figure 1:
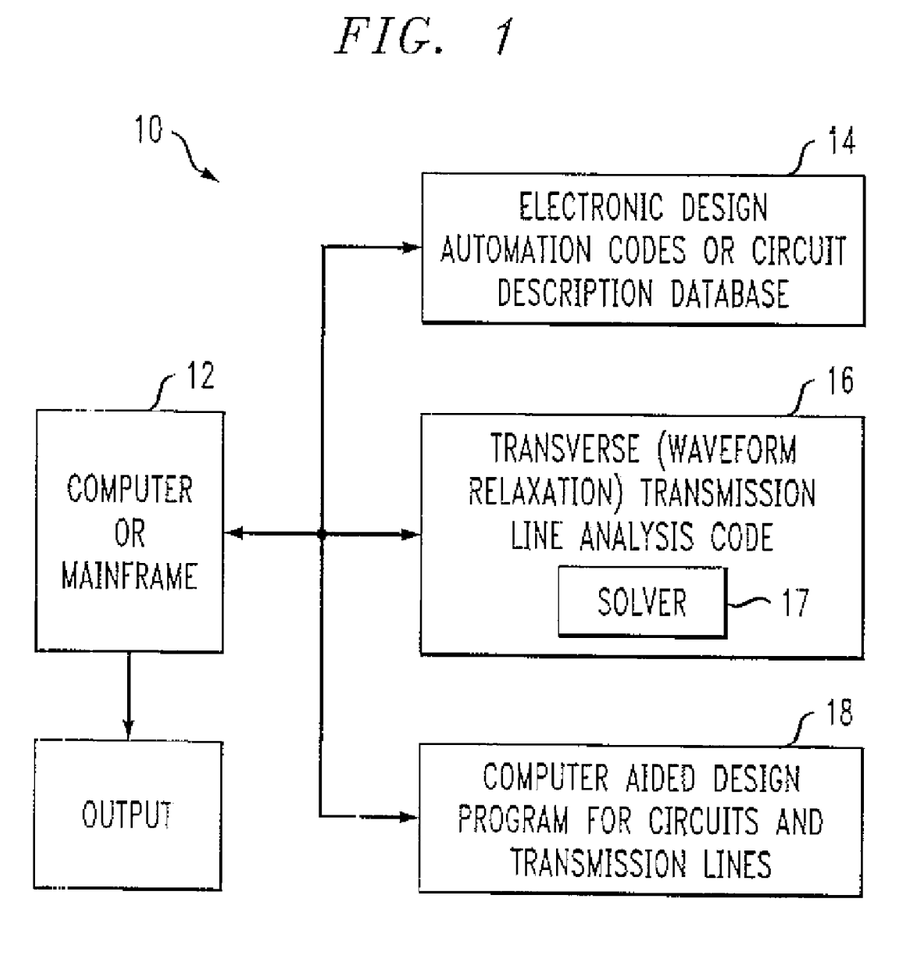
FIG. 1 is a block diagram illustrating a system in accordance with an embodiment of the present invention.

FIG. 1 is a block diagram illustrating a system 100 in which the present invention can operate. As shown in FIG. 1, an exemplary system 10 includes a computer 12, such as a personal computer or a mainframe. Computer 12 includes any interface devices known in the art. Computer 12 may include a plurality of modules or software packages that may be resident in the system or coupled thereto via a network or the like. For example, computer 12 may be provided access to electronic design automation (EDA) libraries or other circuit databases 14, which include electrical circuits or integrated circuit chip designs.

A module 16 may include one more programs or subroutines for carrying out methods in accordance with the present invention. Module 16 may include transmission line analysis programs, including a solver 17 or code to determine coupling factors, perform sliding calculations, update coupling models and perform transient analysis, among other things as will be described in greater detail herein below. Module 16 may be incorporated into other programming packages, such as lull-blown circuit analysis systems or programs. In addition, as discussed further below in conjunction with FIGS. 5 and 10-12, the module 16 includes one or more processes 500, 1000, 1100 and 1200 for implementing the present invention.

A computer aided design (CAD) module or program 18 may be included to import designs or design information to the system 10 to provide the appropriate circuit analysis CAD schematics and or EDA data from database 14 may be employed as inputs to module 16 to analyze components of a design, and preferably transmission lines in the design.

Figure 2:
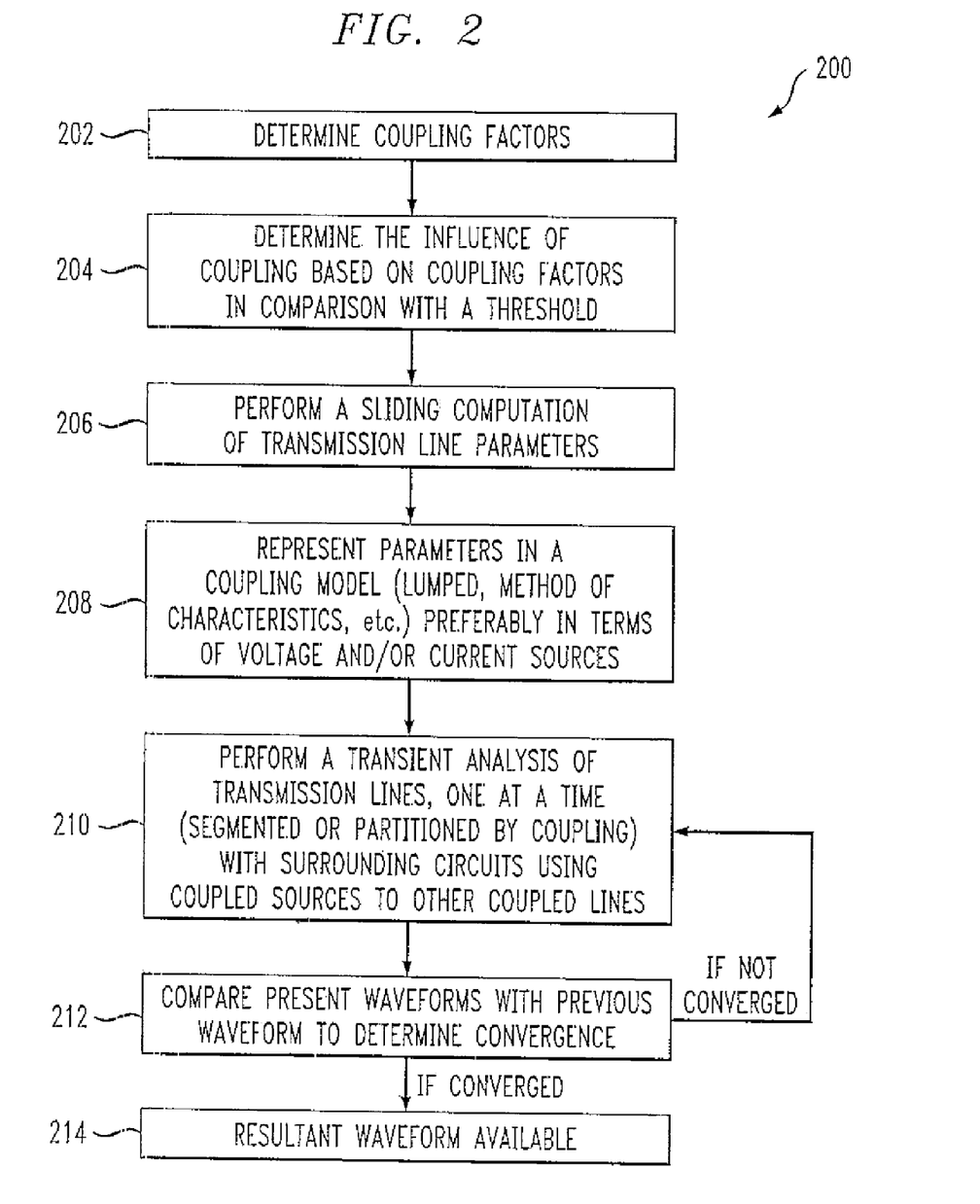
FIG. 2 is a flow diagram illustrating a method for transmission line analysis using a transverse waveform relaxation process.

FIG. 2 is a flow diagram illustrating a method 200 for transmission line analysis using a transverse waveform relaxation process. The transmission line analysis process 200 may be referred to as a transverse waveform relaxation process. In circuit designs, one or more transmission lines may be present. To handle a plurality of coupled lines, the impact of each neighboring transmission line needs to be considered. For a more detailed discussion of suitable transverse waveform relaxation processes, see, for example, U.S. patent application Ser. No. 10/776,716, entitled "System and Method For Efficient Analysis of Transmission Lines," or Nakhla et al, "Simulation of Coupled Interconnects Using Waveform Relaxation and Transverse Partitioning," EPEP'04, Vol 13, pp 25-28, Portland, Oreg., October 2004, each incorporated by reference herein.

Generally, the transversal waveform relaxation algorithm 200 initializes the electrical states of all wiles; analyzes every wire at a time with couplings from all other wires implemented with known voltage and current sources; and iterates until convergence.

The exemplary transverse waveform relaxation process 200 shown in FIG. 2 addresses neighbor-to-neighbor coupling early on in the process. This keeps the problem sparse if the model includes a large number of coupled transmission lines. Also, a coupling model of parameters, which have to be computed at the same time, is limited to a relatively small number. The model limits the number of coupled sources needed to represent the couplings. Then, each wile is individually analyzed as a subcircuit while the coupled sources are taken into account, and the waveforms between the last two iterations are compared to check for convergence.

In block 202, coupling factors are determined for transmission lines in a given design Coupling factors are determined by calculating the influence of neighboring lines on a given line. In one embodiment, an inductance coupling factor (cf) may be calculated as:

$$cf = \frac{L_{12}}{\sqrt{L_{11}L_{22}}}$$

where $L_{12}$ is the inductive influence of $L_2$ on $L_1$ (coupling term) and $L_{11}$ is the inductance of line 1 and $L_{22}$ is the inductance of line 2 (these may be referred to as self terms). A similar coupling factor can be calculated for resistance $$\left(cf = \frac{R_{12}}{\sqrt{R_{11}R_{22}}}\right)$$

and capacitance $$\left(cf = \frac{C_{12}}{\sqrt{C_{11}C_{22}}}\right).$$

Other coupling factors may be used and preferably dimensionless variables. Also, default values, e.g., 0001, may be inserted into the program for coupling factors to ensure a nonzero number exists in the case where the coupling factor is not available or for other reasons.

The coupling factors are estimated first with approximate computations. This leads to the knowledge of how many transmission lines are to be included in each segment of the calculation. The segments are computed in an overlapping way such that all the interactions are taken into account so that each line can be analyzed individually taking into account the pertinent couplings for each line.

After calculating the coupling factors for transmission lines in a design, the coupling factors are compared to a threshold value(s), in block 204, to determine if they will have an influence on neighboring lines. For example, $L_{coupling} < L_{tolerance}$; $C_{coupling} < C_{tolerance}$; and $R_{coupling} < R_{tolerance}$.

The tolerance or threshold is preferably set by a designer but can also be calculated based on parameters or criteria for a given design. For example, in sensitive equipment, a smaller tolerance may be needed meaning smaller influences should be considered in analyzing transmission line parameters. Coupling factors that are determined to be too small may be disregarded in future calculations for a given segment. However, since many circuits are dynamic and different portions of a circuit may be operational at a different time, different time frames may be investigated to ensure a complete solution.

For example, for a given line, coupling factors are employed to determine the influence of other lines on the line in question. Based on these estimates, the calculations are segmented for each line to include the most influential coupling effects.

In block 206, a sliding computation is performed to calculate transmission line parameters (L, C and R). These calculations are preferably based on geometric features. The calculation of the per-unit line parameters L, R, and C is preferably performed in a segmented way, since the simultaneous calculation of these matrix quantities is very expensive for more than a few lines. Hence, each segmented calculation will include the computation of the L, R, C parameters for a number of lines. The number of steps needed to determine these parameters is much smaller than the total number of lines since the most influential lines are considered. This simplifies the evaluation of the L, R, C parameters since each sub-problem is much smaller than the large single evaluation of each parameter.

For example, assuming 100 transmission lines, the coupling evaluation determines that 5 lines should be included neat each line to accurately take the coupling into account. So for the sliding calculation, the first 15 lines are evaluated simultaneously using, for example, a standard field solver for L, R and C. This result can be used for the first 10 lines in the transverse waveform relaxation (WR) approach given herein. Then, in a next sliding field calculation, the next L, R, C, are evaluated for 15 lines from line 10 to line 25. Then, this calculation can be used to evaluate the transverse WR for lines 11 to 20, and so on. Hence, the field calculation is completed only on a subset of the lines which is much faster since the compute time of the field solver increases enormously with the number of lines considered.

In one embodiment, the characteristics of a circuit as defined in a CAD schematic are employed to make these sliding calculations. The sliding calculations provide a baseline for the transient analysis as will be described hereinafter.

Based on the sliding computation, in block 208, a coupling model or models are employed to reduce the circuit characteristics into terms of voltage and/or current sources with lumped elements (L, R, C) or alternately uses the method of characteristic models to model the circuit.

In block 210, a transient of frequency domain analysis of the transmission lines is performed preferably one wire at a time. The transient/frequency analysis is based on a transmission line response to surrounding circuits using coupled sources to other coupled lines as provided by the models set forth in block 208.

In one embodiment, partitioning along the coupling of the lines is performed. In other words, each line is taken one at a time considering the most pertinent coupling influences on that line. Alternately, partitioning over the length of the line may be performed as well or in addition to a calculation for the partitioning of the coupling of the line.

In block 212, the transient analysis of block 210 is repeated until convergence is achieved by comparing a previous value of the waveforms determined by the transient analysis from a previous iteration to the waveforms determined in the present iteration. If convergence is achieved the resultant waveforms have been determined and are available in block 214. If convergence has not yet been achieved, then the program returns to block 210 to recalculate the waveforms.

As previously indicated, the present invention provides methods discussed further below in conjunction with FIG. 4 to determine the number of iterations needed for a computed solution to achieve a given level of accuracy.

Figure 3:
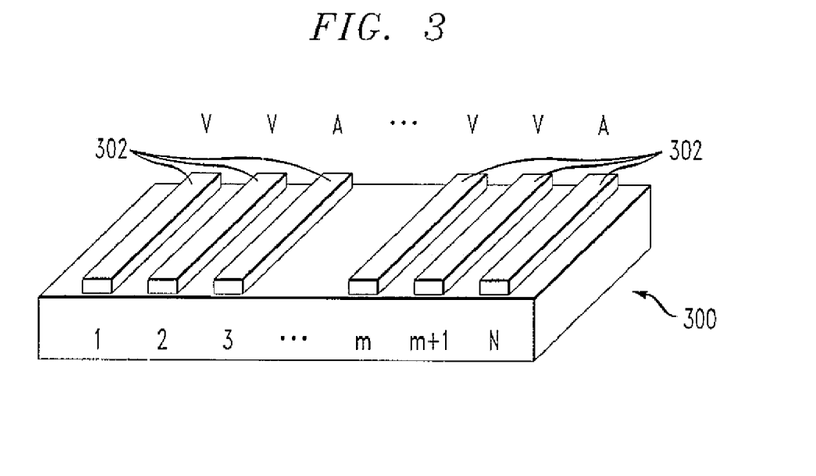
FIG. 3 depicts an illustrative geometry for a multiple transmission lines to be analyzed in accordance with the present invention.

FIG. 3 depicts an illustrative geometry 300 for a multiple transmission lines to be analyzed in accordance with the present invention. Transmission lines 302 are numbered 1 to N in the depicted section of a circuit 300. Lines 302 are marked with an A to indicate that they are aggressor lines. These lines are exited with some external circuitry. In contrast, the lines which are marked with a V are victim lines which are not excited with external sources.

Using one method, e.g., set forth with reference to FIG. 2, the subcircuits/lines of FIG. 3 are analyzed starting at line 1, in sequence, until line N is reached. This sequence is followed for each calculation in FIG. 2. Then, the sequence is repeatedly followed go until convergence in the transient/frequency analysis (e.g., blocks 210 and 212).

A more efficient method is based on signal flow. Fox example, initially, all coupled waveform sources are set to zero. Then, starting with the analysis of the circuits, which include the aggressors (A) first, new coupled-source quantities are available from the coupling model (block 206). Then, the nearest neighbors are analyzed since they will include the largest signals next to the aggressors. The process progresses through all the wires until all of the wires have been visited. In each step/iteration, the latest, updated waveforms are employed.

These methods are directly applicable to parallel processing for circuit problems, which include transmission lines. Each of the N transmission lines forms a separate subsystem with a transverse decoupling scheme (e.g., portioning along coupling lines or effects). Further partitioning is possible along the length of the line using conventional techniques.

Partitioning or segmenting line by line (coupling) leads to 2N subsystems which can be analyzed on separate processors where the only information that needs to be exchanged between processors is waveforms. Hence, an enormous gain in speeding up the process by parallel processing is achieved.

Decoupling of Connectors

As previously indicated, the present invention provides methods and apparatus for analyzing transmission lines with decoupling of connectors, such that entire paths are decoupled from each other. The electrical couplings between the paths of the multipath circuit are embodied using current controlled sources. At each step of the Transversal Waveform Relaxation process, the states of these sources are updated using the path states from the previous step. Since the capacitive and inductive couplings are generally weak in a multipath design, the Transversal Waveform Relaxation process converges in a rapid manner to the correct signal waveforms for all paths.

Figure 4:
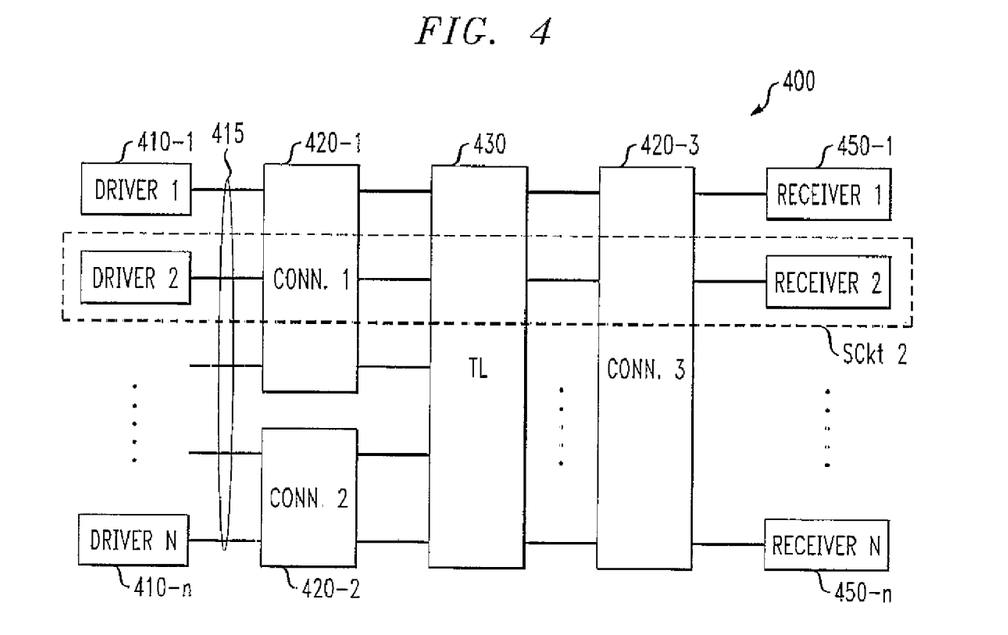
FIG. 4 illustrates an exemplary transmission line system that can be analyzed using the disclosed techniques.

FIG. 4 illustrates an exemplary transmission line system 400 that can be analyzed using the disclosed techniques. As shown in FIG. 4, a plurality of drivers 410-1 through 410-N drive a plurality of paths 415, one or more of which may be connected by one or more connectors 420-1 through 420-M (hereinafter, collectively referred to as connectors 420), through a number of transmission lines 430. The transmitted signals are received by one or more receivers 450-1 through 450-N.

The transmission lines 43-0 can be analyzed using the Transversal Waveform Relaxation techniques referenced above. The present invention provides a Transversal Waveform Relaxation algorithm that decouples the connectors 420 as well.

In general, the techniques of the present invention can be applied to any system, such as the system 400, having basic circuit elements, such as drivers 410, receivers 450, connectors 420 and transmission lines 430, as well as other potential coupled parasitic circuits (not shown). According to one aspect of the invention, each circuit model for each basic circuit element must be decoupled such that each path can be analyzed independently. The circuits must be designed such that the coupling factors between each of the paths is small, typically k<<0.2, in a known manner. It has been shown that for such small coupling cases, the Transversal Waveform Relaxation approach converges in a rapid manner.

The coupling factor between paths can approximately be defined for the large class of inductive $k_l$ and/or capacitively coupled circuits $k_c$ as $$k_l = L_{12}/L_{22} \quad (1)$$

and $$k_c = C_{12}/C_{22} \quad (2)$$

Here, $C_{12}$ and $L_{12}$ are the coupling factors in the models for the different elements and $C_{22}$ and $L_{22}$ are the self elements into which the coupling occurs. These path-to-path coupling factors imply that the coupling, while being very important for the accurate analysis of the problem, are moderate. These considerations apply to the general situation even if they are generally applicable.

As discussed further below, each of the model elements in the general circuit 400 given in FIG. 4 is replaced with a circuit model that allows each individual path to be separated within the model with a Waveform Relaxation coupling only. A formulation is provided fox a macromodel that is applicable to a wide set of different structures. In addition, as discussed further below in conjunction with FIG. 5, the component parts from each path through the system 400 form a subcircuit, such as the subcircuit SCkt 2 shown in FIG. 4

Figure 5:
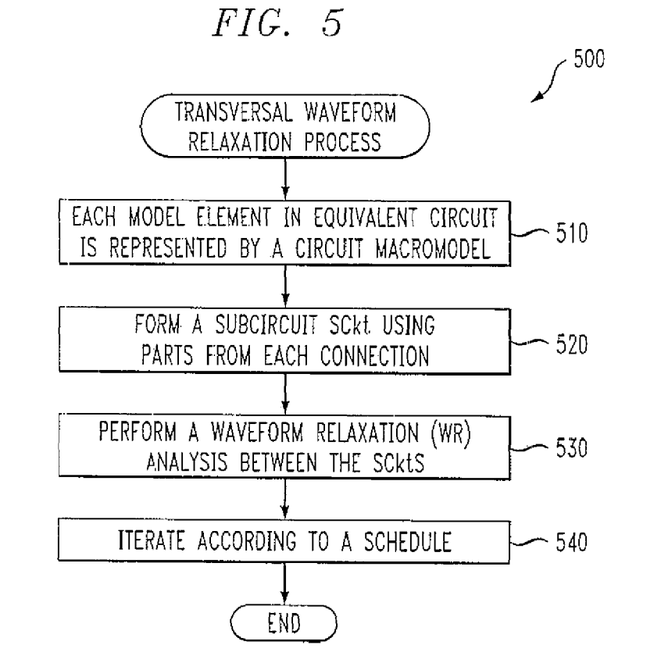
FIG. 5 illustrates a flow chart describing an exemplary Transversal Waveform Relaxation process incorporating features of the present invention.

FIG. 5 illustrates a flow chart describing an exemplary Transversal Waveform Relaxation process 500 incorporating features of the present invention. As shown in FIG. 5, the Transversal Waveform Relaxation process 500 initially represents each model element in the equivalent circuit during step 510 by a circuit macromodel, as discussed further below in conjunction with FIGS. 6-9. The circuit macromodels separate each path that enters and exits a given element such that it is coupled only with elements suitable for waveform relaxation analysis. Fox example, the model for connector 420-1 in FIG. 4 should be divided into at least three macromodels, one fox each through connection.

As discussed further below in conjunction with FIG. 11, a subcircuit SCkt is formed during step 520 from the component parts from each path through the system 400. For example, a first subcircuit, SCkt 1, includes Driver 1 510-1, Part 1 of Connector 1 520-1, the first line in the multi-transmission line 430, the first part of Connector 3 420-3 and finally Receiver 1 450-1

A waveform relaxation (WR) analysis, such as those referenced above, is performed during step 530 between each of the subcircuits, SCkts. The results are updated with new results as the resultant waveforms become available for each of the subcircuits, SCkts.

Finally, the Transversal Waveform Relaxation process 500 iterates during step 540 according to a schedule, such as a sequential schedule of SCkt 1, SCkt 2, . . . , SCkt N. If the coupling is weak enough, then this schedule needs to be executed only a few times. Also, for weak couplings, integration can be done over all time rather than in time windows.

Partitioned Macromodels

A multiport circuit can be characterized in terms of different but equivalent parameters, such as Y (admittance), Z (impedance), H (hybrid), or S (scattering). A formulation based on the admittance Y parameters is considered below for such a network as $$\begin{bmatrix} Y_{11} & Y_{12} & \dots & Y_{1n} \\ Y_{21} & Y_{22} & \dots & Y_{2n} \\ \dots & \dots & \dots & \dots \\ Y_{n1} & Y_{n2} & \dots & Y_{nn} \end{bmatrix} \begin{bmatrix} V_1(s) \\ V_2(s) \\ \dots \\ V_n(s) \end{bmatrix} = \begin{bmatrix} I_1(s) \\ I_2(s) \\ \dots \\ I_n(s) \end{bmatrix} \quad (3)$$

Since each entry $Y_{ij}$ is expressed in the complex frequency, the standard approach is to invoke some type of least square approximation-based technique to fit the data from sample frequency points to a complex rational function H(s), where $$H(s) = g + \sum_{i=1}^{q} \frac{r_i}{s - p_i} \quad (4)$$

where $p_i$ and $r_i$ are the i-th pole-residue pair, q is the total number system poles and g is quotient.

Figure 6:
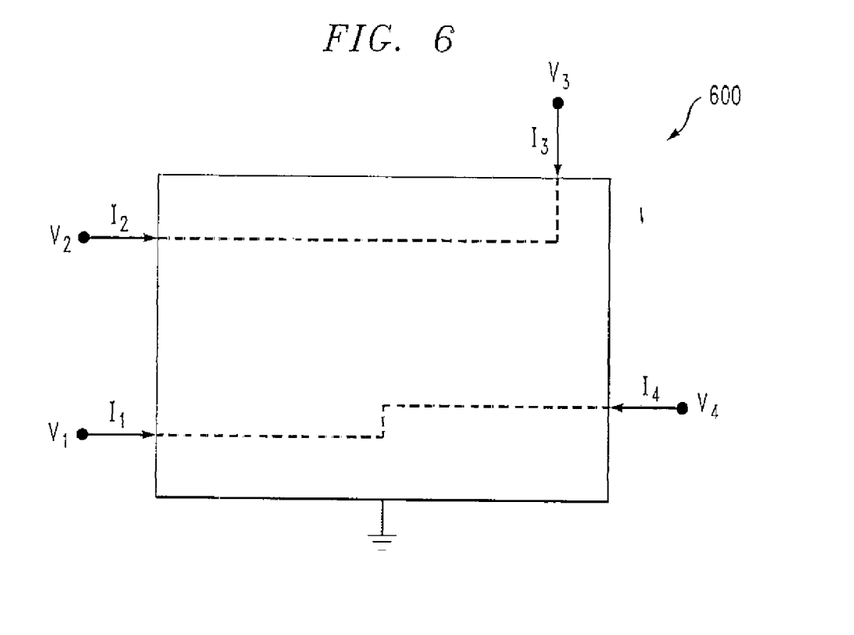
FIG. 6 illustrates an exemplary four-port circuit having two illustrative poles.

FIG. 6 illustrates an exemplary four-port circuit 600 having, for illustrative purpose, two poles. The exemplary circuit 600 is the smallest case that includes sufficient complexity while illustrating the important aspects of such a model. The transfer function for this circuit 600 can be described by $$\begin{bmatrix} g_{11} + \sum_{i=1}^{2} \frac{r_i^{11}}{s-p_i} & \sum_{i=1}^{2} \frac{r_i^{12}}{s-p_i} & \sum_{i=1}^{2} \frac{r_i^{13}}{s-p_i} & \sum_{i=1}^{2} \frac{r_i^{14}}{s-p_i} \\ \sum_{i=1}^{2} \frac{r_i^{21}}{s-p_i} & g_{22} + \sum_{i=1}^{2} \frac{r_i^{22}}{s-p_i} & \sum_{i=1}^{2} \frac{r_i^{23}}{s-p_i} & \sum_{i=1}^{2} \frac{r_i^{24}}{s-p_i} \\ \sum_{i=1}^{2} \frac{r_i^{31}}{s-p_i} & \sum_{i=1}^{2} \frac{r_i^{32}}{s-p_i} & g_{33} + \sum_{i=1}^{2} \frac{r_i^{33}}{s-p_i} & \sum_{i=1}^{2} \frac{r_i^{34}}{s-p_i} \\ \sum_{i=1}^{2} \frac{r_i^{41}}{s-p_i} & \sum_{i=1}^{2} \frac{r_i^{42}}{s-p_i} & \sum_{i=1}^{2} \frac{r_i^{43}}{s-p_i} & c_{44} + \sum_{i=1}^{2} \frac{r_i^{44}}{s-p_i} \end{bmatrix} \quad [5]$$

$$\begin{bmatrix} V_1(s) \\ V_2(s) \\ V_3(s) \\ V_4(s) \end{bmatrix} = \begin{bmatrix} I_1(s) \\ I_2(s) \\ I_3(s) \\ I_4(s) \end{bmatrix}$$

Figure 7:
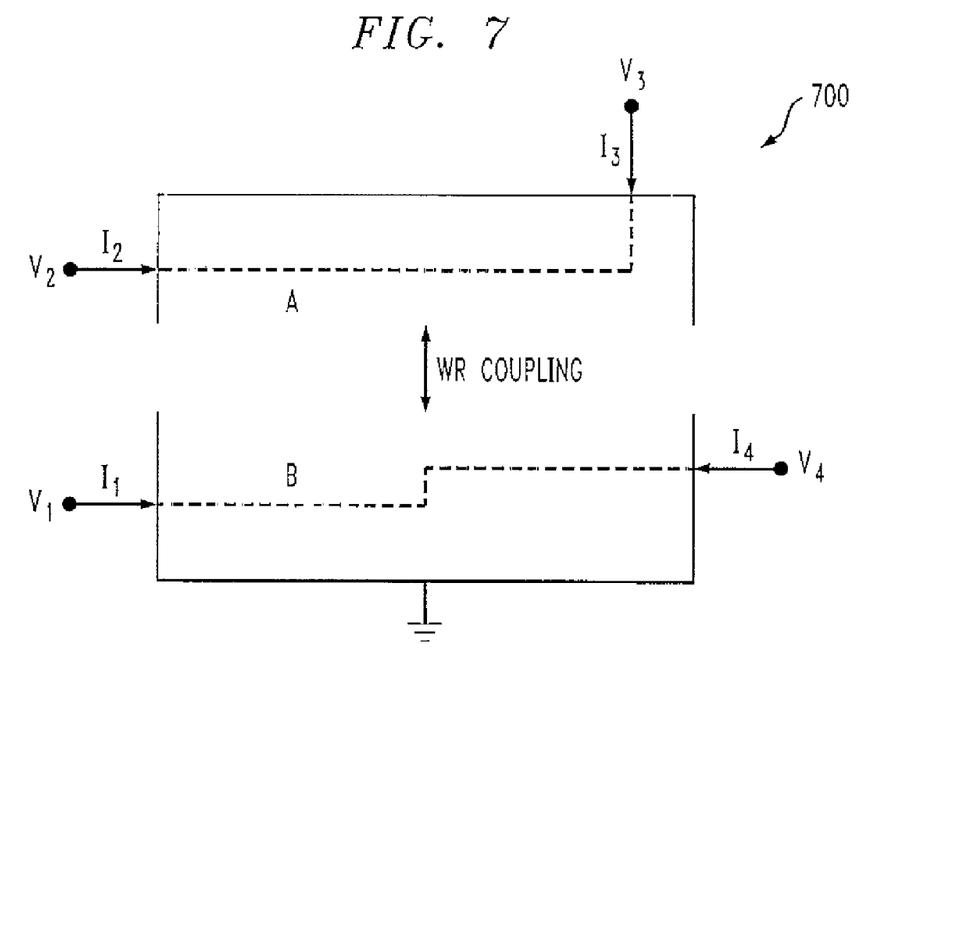
FIG. 7 illustrates the partitioning for the circuit of FIG. 6.

It can be observed that each element in the above matrix of equation (5) consists of several parts representing the various mechanisms for the paths and the couplings. It should be noted that the formulation allows a resistive coupling among all the elements. However, the through connection wire resistance is much smaller than any other coupling mechanism, as discussed above FIG. 7 illustrates the partitioning 700 for the circuit 600 of FIG. 6. It is noted that the coupling between the two paths in FIG. 7 is relatively small.

It can be shown that the dynamic potentially inductive part may be included in the sums of rational fractions where each pole is given by $r_a^{ij}/(s-p_a)$, following a conventional scheme of using a set of state variables $x_j$, one variable for each pole per port. For its corresponding time-domain equations, eight state variables are introduced for the above transfer function (equation (5)) of a four-port circuit 600. A generally Jordan-canonical form of realization for this system produces the following set of equations:

$$\begin{bmatrix} \dot{x}_1 \\ \dot{x}_2 \\ \dot{x}_3 \\ \dot{x}_4 \\ \dot{x}_5 \\ \dot{x}_6 \\ \dot{x}_7 \\ \dot{x}_8 \end{bmatrix} = \begin{bmatrix} p_1 & 0 & 0 & 0 & 0 & 0 & 0 & 0 \\ 0 & p_1 & 0 & 0 & 0 & 0 & 0 & 0 \\ 0 & 0 & p_1 & 0 & 0 & 0 & 0 & 0 \\ 0 & 0 & 0 & p_1 & 0 & 0 & 0 & 0 \\ 0 & 0 & 0 & 0 & p_2 & 0 & 0 & 0 \\ 0 & 0 & 0 & 0 & 0 & p_2 & 0 & 0 \\ 0 & 0 & 0 & 0 & 0 & 0 & p_2 & 0 \\ 0 & 0 & 0 & 0 & 0 & 0 & 0 & p_2 \end{bmatrix} \begin{bmatrix} x_1 \\ x_2 \\ x_3 \\ x_4 \\ x_5 \\ x_6 \\ x_7 \\ x_8 \end{bmatrix} + \begin{bmatrix} 1000 \\ 0100 \\ 0010 \\ 0001 \\ 1000 \\ 0100 \\ 0010 \\ 0001 \end{bmatrix} \begin{bmatrix} v_1 \\ v_2 \\ v_3 \\ v_4 \end{bmatrix} \quad (6)$$

-continued $$\begin{bmatrix} i_1 \\ i_2 \\ i_3 \\ i_4 \end{bmatrix} = \begin{bmatrix} r_1^{11} & r_1^{12} & r_1^{13} & r_1^{14} & r_2^{11} & r_2^{12} & r_2^{13} & r_2^{14} \\ r_1^{21} & r_1^{22} & r_1^{23} & r_1^{24} & r_2^{21} & r_2^{22} & r_2^{23} & r_2^{24} \\ r_1^{31} & r_1^{32} & r_1^{33} & r_1^{34} & r_2^{31} & r_2^{32} & r_2^{33} & r_2^{34} \\ r_1^{41} & r_1^{42} & r_1^{43} & r_1^{44} & r_2^{41} & r_2^{42} & r_2^{43} & r_2^{44} \end{bmatrix} \begin{bmatrix} x_1 \\ x_2 \\ x_3 \\ x_4 \\ x_5 \\ x_6 \\ x_7 \\ x_8 \end{bmatrix} + \begin{bmatrix} g_{11} & 0 & 0 & 0 \\ 0 & g_{22} & 0 & 0 \\ 0 & 0 & g_{33} & 0 \\ 0 & 0 & 0 & g_{44} \end{bmatrix} \begin{bmatrix} v_1 \\ v_2 \\ v_3 \\ v_4 \end{bmatrix} \quad (7)$$

Figure 8:
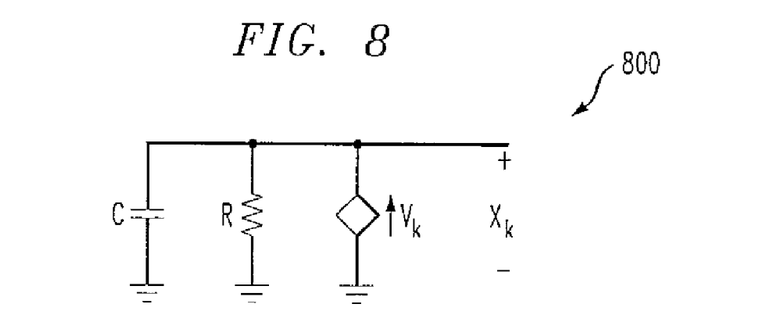
FIG. 8 illustrates an exemplary non-physical equivalent circuit that can be made for a number of state variables.

The above matrix form can be rewritten into a set of equations that awe transformed into a circuit. The state part of the circuit is given by eight circuits described by the following equations:

$$\dot{x}_1 = p_1 x_1 + v_1 \quad (8)$$
$$\dot{x}_2 = p_1 x_2 + v_2 \quad (9)$$
$$\dot{x}_3 = p_1 x_3 + v_3 \quad (10)$$
$$\dot{x}_4 = p_1 x_4 + v_4 \quad (11)$$
$$\dot{x}_5 = p_2 x_5 + v_1 \quad (12)$$
$$\dot{x}_6 = p_2 x_6 + v_2 \quad (13)$$
$$\dot{x}_7 = p_2 x_7 + v_3 \quad (14)$$
$$\dot{x}_8 = p_2 x_8 + v_4 \quad (15)$$

FIG. 8 illustrates an exemplary non-physical equivalent circuit 800 that can be made for each of the state variables of equations (8) through (15). The values of the capacitances must be chosen such that the MNA (Modified Nodal Analysis) analysis matrix in the circuit solver used is well conditioned.

Figure 9:
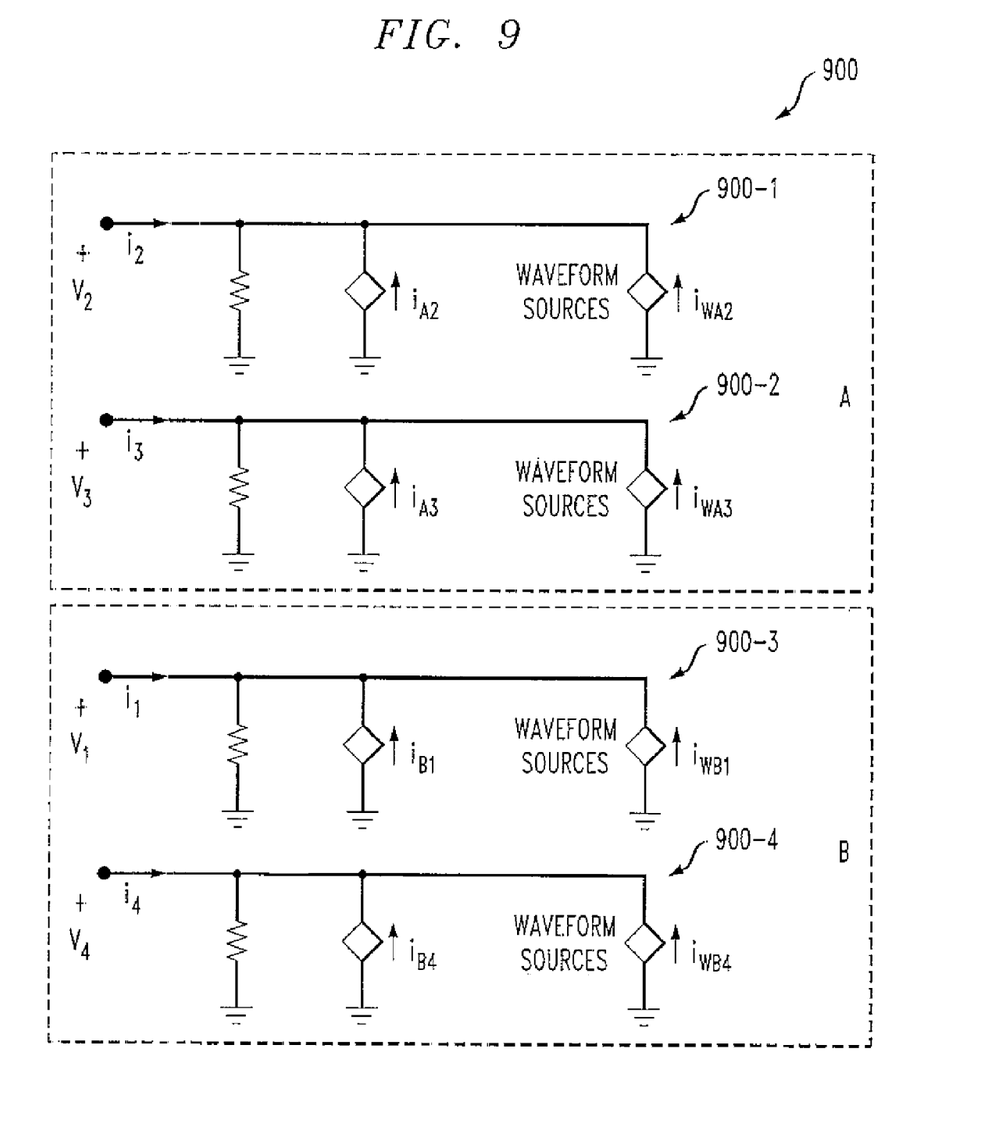
FIG. 9 illustrates exemplary macromodel circuits for the partitioned foul terminal circuit of FIG. 7.

FIG. 9 illustrates exemplary macromodel circuits 900-1 through 900-4 for the partitioned four terminal circuit 700 of FIG. 7. As shown in FIGS. 7 and 9, the exemplary macromodel circuits are separated into two portions, A and B, in such a way that they are coupled only by waveform sources. In this manner, each portion A and B can be solved separately so that the interaction between them can be taken into account with the transverse waveform relaxation process. For the A part of the macromodel, it can be shown from equation (7):

$$i_2 = g_{22}v_2 + r_1^{21}x_1 + r_1^{22}x_2 + r_1^{23}x_3 + r_1^{24}x_4 + r_2^{21}x_5 + r_2^{22}x_6 + r_2^{23}x_7 + r_2^{24}x_8 \quad (16)$$

where the direct (intrinsic) state variable sources for the first A part 900-1 are given by $$i_{A2} = r_1^{22}x_2 + r_1^{23}x_3 + r_2^{22}x_6 + r_2^{23}x_7 \quad (17)$$

and the waveform sources for the first A part 900-1 are $$i_{WA2} = r_1^{21}x_1 + r_1^{24}x_4 + r_2^{21}x_5 + r_2^{24}x_8 \quad (18)$$

and the second subcircuit 900-2 of A is $$i_3 = g_{33}v_3 + r_1^{31}x_1 + r_1^{32}x_2 + r_1^{33}x_3 + r_1^{34}x_4 + r_2^{31}x_5 + r_2^{32}x_6 + r_2^{33}x_7 + r_1^{34}x_8 \quad (19)$$

where the current sources for the second A part 900-2 are given by $$i_{A3} = r_1^{32}x_2 + r_1^{33}x_3 + r_2^{32}x_6 + r_2^{33}x_7 \quad (20)$$

and the waveform sources for the second A part 900-2 are $$i_{WA3} = r_1^{31}x_1 + r_1^{34}x_4 + r_2^{31}x_5 + r_2^{34}x_8 \quad (21)$$

The B part of the partitioned macromodel is given from equation (7):

$$i_1 = g_{11}v_1 + r_1^{11}x_1 + r_1^{12}x_2 + r_1^{13}x_3 + r_1^{14}x_4 + r_2^{11}x_5 + r_2^{12}x_6 + r_2^{13}x_7 + r_2^{14}x_8 \quad (22)$$

where the direct (intrinsic) state variable sources fox the first B part 900-3 are given by $$i_{B1} = r_1^{11} + x_1 + r_1^{14}x_4 + r_2^{11}x_5 + r_2^{14}x_8 \quad (23)$$

and the waveform sources for the first B part 900-3 are $$i_{WB1} = r_1^{12}x_2 + r_1^{13}x_3 + r_2^{12}x_6 + r_2^{13}x_7 \quad (24)$$

For the second subcircuit 900-4 in B:

$$i_4 = g_{44}v_4 + r_1^{41}x_1 + r_1^{42}x_2 + r_1^{43}x_3 + r_1^{44}x_4 + r_2^{41}x_5 + r_2^{42}x_6 + r_2^{43}x_7 + r_2^{44}x_8 \quad (25)$$

where the direct state variable sources for the second B part 900-4 are given by $$i_{B4} = r_1^{41} + x_2 + r_1^{44}x_4 + r_2^{41}x_5 + r_2^{44}x_8 \quad (26)$$

and the waveform sources for the second B part 900-4 are $$i_{WB4} = r_1^{42} + x_2 + r_1^{43}x_3 + r_2^{42}x_6 + r_2^{43}x_7 \quad (27)$$

Here, the voltages and currents are real circuit variables connected to the rest of the circuit. Each equation has been arranged such that the first term on the right hand side always denotes the self-conductance while the remaining terms of the same equation denote the coupling voltage controlled current sources from the system for each disjoint sub-circuit, where v and i denote the port node voltage and current vector. In summary, this exemplifies the process for subdividing a component such that the above transverse waveform relaxation algorithm can be applied to decouple the connectors.

Figure 10:
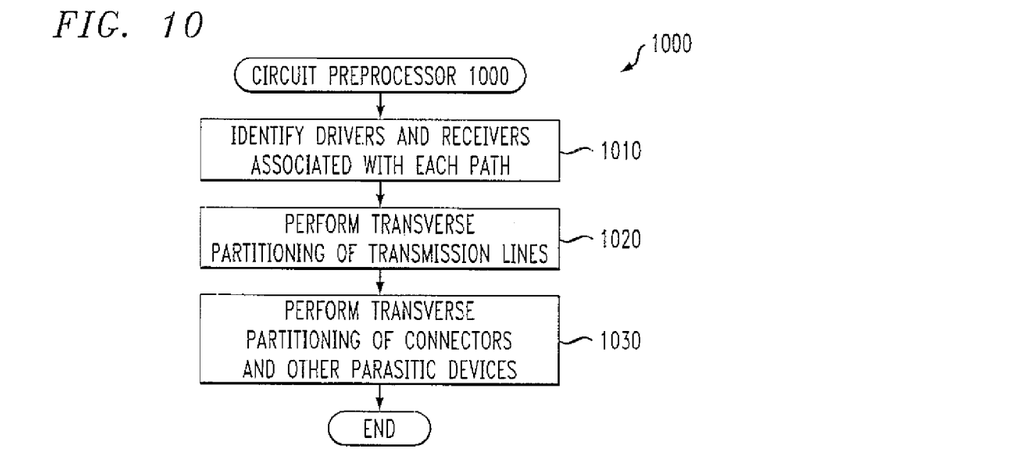
FIG. 10 is a flow chart describing an exemplary implementation of a circuit preprocessor.

FIG. 10 is a flow chart describing an exemplary implementation of a circuit preprocessor 1000. As shown in FIG. 10, the circuit preprocessor 1000 initially identifies the drivers and receivers associated with each path during step 1010. Thereafter, the circuit preprocessor 1000 performs a transverse partitioning of the transmission lines during step 1020 using existing techniques. Finally, the circuit preprocessor 1000 performs a transverse partitioning of the connectors and other parasitic devices during step 1030 in accordance with the present invention.

Figure 11:
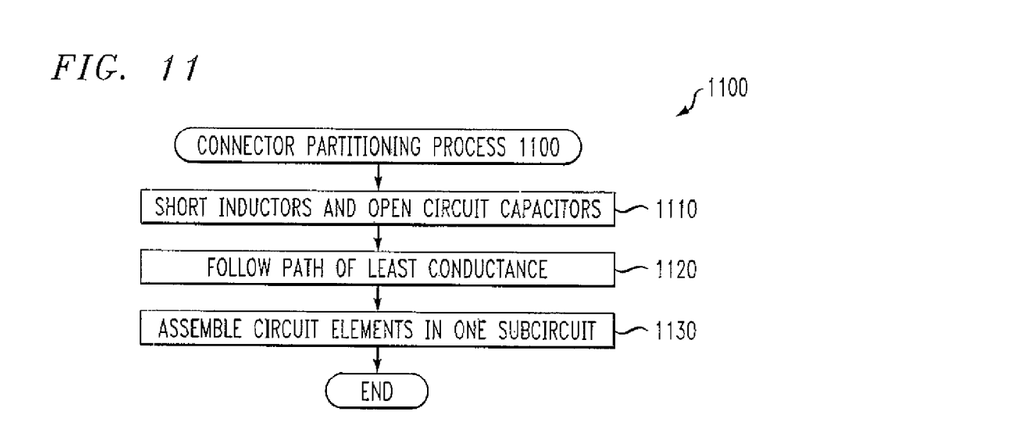
FIG. 11 is a flow chart describing an exemplary implementation of a connector partitioning process.

FIG. 11 is a flow chart describing an exemplary implementation of a connector partitioning process 1100. As shown in FIG. 11, the connector partitioning process 1100 initially shorts the inductors and open circuits the capacitors in the circuit during step 1110 thereafter, the connector partitioning process 1100 follows the path of least conductance during step 1120 and assembles the circuit elements in one subcircuit during step 1130.

Figure 12:
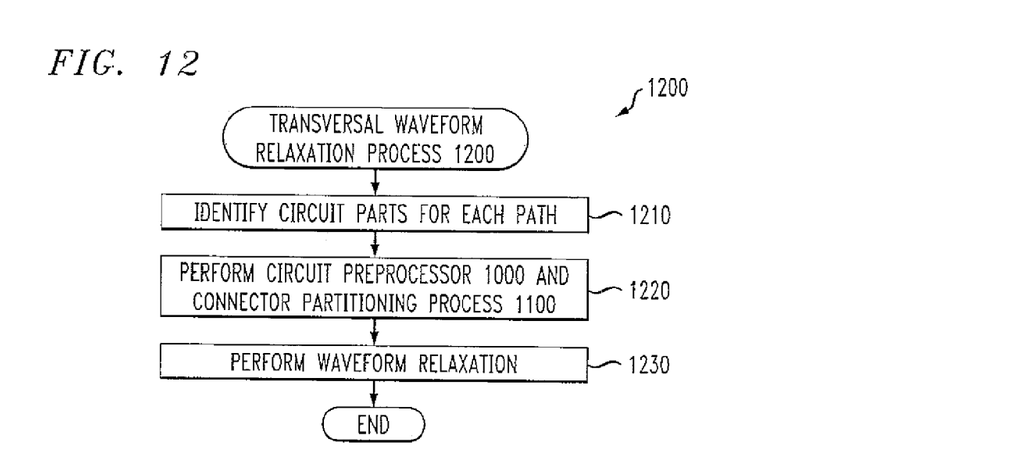
FIG. 12 is a flow chart describing an exemplary implementation of a Transversal Waveform Relaxation process according to the present invention

FIG. 12 is a flow chart describing an exemplary implementation of a Transversal Waveform Relaxation process 1200 according to the present invention. As shown in FIG. 12, the Transversal Waveform Relaxation process 1200 initially identifies the circuit parts for each path during step 1210, such as drivers (sources), connectors, transmission lines, parasitics and receivers (terminations). The circuit preprocessor 1000 and connector partitioning process 1100 are performed during step 1220. Finally, a waveform relaxation is performed during step 1230.

Thus, an algorithm is provided for the fast electrical analysis of multipath data transmission circuits. The algorithm includes a transversal partitioning step based on the DC current paths, and the use of waveform relaxation algorithm where the coupling between the paths is implemented using controlled current sources. At each step of the relaxation process, the electrical state of the controlled sources is determined by the electrical state of the multipath circuit in the previous state. When the coupling between the different paths are weak (the case of a working design), the relaxation process takes only few iterations to converge.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computers. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the worldwide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

What is claimed is:

1. A method for analyzing a circuit comprising one or more non-transmission-line connecting elements, comprising:
   partitioning at least one of said non-transmission-line connecting elements in a transverse manner;
   identifying a plurality of subcircuits each comprised of circuit elements from a plurality of transmission lines and one or more non-transmission-line connecting elements in a given path; wherein each of said subcircuits is associated with a path in said circuit;
   performing a waveform relaxation analysis between at least two of said subcircuits; and
   repeating said step of performing said waveform relaxation analysis using waveforms determined in a previous iteration until convergence has occurred.

2. The method of claim 1, further comprising the step of partitioning said plurality of transmission lines in a transverse manner.

3. The method of claim 2, further comprising the step of representing each of said plurality of transmission lines and one or more non-transmission -line connecting elements using a circuit macromodel.

4. The method of claim 3, wherein said circuit macromodel separates each path that enters and exits a given element such that it is coupled only with elements suitable for waveform relaxation analysis.

5. The method of claim 1, wherein said repeating step iterates according to a predefined schedule.

6. The method of claim 1, wherein said identifying step further comprises the step of one or more of shorting one or more inductors in said circuit and opening one or more capacitors in said circuit.

7. The method of claim 1, wherein electrical couplings between the paths of said circuit are embodied using current controlled sources.

8. The method of claim 7, wherein at each step of said waveform relaxation analysis, the states of said sources are updated using the path states from a previous step.

9. The method of claim 1, wherein said identifying step further comprises the step of following a path of least conductance.

10. An apparatus for analyzing a circuit comprising one or more non-transmission-line connecting elements, comprising:
    a memory; and
    at least one processor, coupled to the memory, operative to:
    partition at least one of said non-transmission-line connecting elements in a transverse manner;
    identify a plurality of subcircuits each comprised of circuit elements from a plurality of transmission lines and one or more non-transmission-line connecting elements in a given path; wherein each of said subcircuits is associated with a path in said circuit;
    perform a waveform relaxation analysis between at least two of said subcircuits; and
    repeat said performance of said waveform relaxation analysis using waveforms determined in a previous iteration until convergence has occurred.

11. The apparatus of claim 10, wherein said processor is further configured to partition said plurality of transmission lines in a transverse manner.

12. The apparatus of claim 11, wherein said processor is further configured to represent each of said plurality of transmission lines and one or more non-transmission-line connecting elements using a circuit macromodel.

13. The apparatus of claim 12, wherein said circuit macromodel separates each path that enters and exits a given element such that it is coupled only with elements suitable for waveform relaxation analysis.

14. The apparatus of claim 10, wherein said repeating of said performance of said waveform relaxation analysis iterates according to a predefined schedule.

15. The apparatus of claim 10, wherein said processor is further configured to short one or more inductors in said circuit or open one or more capacitors in said circuit.

16. The apparatus of claim 10, wherein electrical couplings between the paths of said circuit are embodied using current controlled sources.

17. The apparatus of claim 16, wherein at each step of said waveform relaxation analysis, the states of said sources are updated using the path states from a previous step.

18. An article of manufacture for analyzing a circuit comprising one or more non-transmission-line connecting elements, comprising a tangible machine readable storage medium containing one or more programs which when executed implement the steps of:
    partitioning at least one of said non-transmission-line connecting elements in a transverse manner;
    identifying a plurality of subcircuits each comprised of circuit elements from a plurality of transmission lines and one or more non-transmission-line connecting elements in a given path; wherein each of said subcircuits is associated with a path in said circuit;
    performing a waveform relaxation analysis between at least two of said subcircuits; and
    repeating said step of performing said waveform relaxation analysis using waveforms determined in a previous iteration until convergence has occurred.

19. The article of manufacture of claim 18, further comprising instructions for the step of partitioning said plurality of transmission lines in a transverse manner.

20. The article of manufacture of claim 19, further comprising instructions for the step of representing each of said plurality of transmission lines and one or more non-transmission-line connecting elements using a circuit macromodel.

* * * * *